US006678855B1

(12) United States Patent
Gemmell

(10) Patent No.: US 6,678,855 B1
(45) Date of Patent: Jan. 13, 2004

(54) SELECTING K IN A DATA TRANSMISSION CAROUSEL USING (N,K) FORWARD ERROR CORRECTION

(75) Inventor: David James Gemmell, Danville, CA (US)

(73) Assignee: Microsoft Corporation, Redmond, WA (US)

( * ) Notice: Subject to any disclaimer, the term of this patent is extended or adjusted under 35 U.S.C. 154(b) by 0 days.

(21) Appl. No.: 09/454,239

(22) Filed: Dec. 2, 1999

(51) Int. Cl.[7] .............................................. H03M 13/00

(52) U.S. Cl. ...................... 714/752; 714/776; 709/231

(58) Field of Search ......................... 709/231; 714/752, 714/776

(56) References Cited

U.S. PATENT DOCUMENTS

| | | | |
|---|---|---|---|
| 5,172,381 A | | 12/1992 | Karp et al. |
| 5,933,593 A | | 8/1999 | Arun et al. |
| 6,073,189 A | | 6/2000 | Bounsall et al. |
| 6,081,909 A | * | 6/2000 | Luby et al. .................. 714/701 |
| 6,141,788 A | | 10/2000 | Rosenberg et al. |
| 6,145,109 A | | 11/2000 | Schuster et al. |
| 6,256,673 B1 | * | 7/2001 | Gayman ..................... 709/231 |
| 6,321,302 B1 | | 11/2001 | Strongin et al. |
| 6,334,171 B1 | | 12/2001 | Hill et al. |
| 6,363,425 B1 | | 3/2002 | Hook et al. |
| 6,378,036 B2 | | 4/2002 | Lerman et al. |

OTHER PUBLICATIONS

Byers, J.W.; Luby, M.; Mitzenmacher, M., "A digital fountain approach to asynchronous reliable multicast",Selected Areas in Communications, IEEE Journal on , vol.: 20 Issue: 8 , Oct. 2002, pp. 1528–1540.*

Vicisano, Crowcroft and Rizzo, "*TCP–like Congestion Control for Layered Multicast Data Transfer*", INFOCOM '98/ San Francisco, Mar. 29–Apr. 2, 1998.

Rizzo and Vicisano, "*A Reliable Multicast data Distribution Protocol based on software FEC techniques*", HPCS '97/ Chalkidiki, Greece, Jun. 23–25, 1997.

Vicisano and Crowcroft, "*One to Many Reliable Bulk–Data Transfer in the M–Bone*", HIPPARCH '97/Uppsala, Sweden, Jun. 12–13, 1997.

Rizzo and Vicisano, "*RMDP: an FEC–based Reliable Multicast Protocol for Wireless Environments*", Mobile Computing and Communications Review, vol. 2, No. 2, pp. 1–10.

* cited by examiner

Primary Examiner—R. Stephen Dildine
(74) Attorney, Agent, or Firm—Lee & Hayes, PLLC

(57) ABSTRACT

Data files can be sent using a data carousel and forward error correction. This involves segregating a file into groups of data blocks, wherein each group represents k data blocks. From the k data blocks of each group, n erasure-encoded blocks are calculated, where n>k. The n erasure-encoded blocks are sent in a round-robin fashion using IP multicast technology: the first erasure-encoded block for each group, then the second block of each group, and so on. Assuming a file having S data blocks, the value of k is selected by first determining the minimum number of groups G of erasure-encoded blocks that can represent the S data object blocks, wherein each group of erasure-encoded blocks represents no more than $k_{max}$ data object blocks. Then, the sender determines the smallest number of data object blocks $k_{min}$ that can be represented in each group while still requiring no more than G groups of erasure-encoded blocks to represent the S data object blocks. The value of k is then limited to $k_{min}$ for each group of transmitted erasure-encoded blocks.

26 Claims, 14 Drawing Sheets

SELECTING K IN A DATA TRANSMISSION CAROUSEL USING (N,K) FORWARD ERROR CORRECTION

TECHNICAL FIELD

This invention relates to distribution of data files and other data objects using IP multicast techniques in conjunction with forward error correction and data carousel techniques. In particular, the invention relates to methods selecting k when using (n,k) encoding techniques.

BACKGROUND OF THE INVENTION

The existence and popularity of the Internet has created a new medium for software distribution. As this distribution method becomes more widely used, it will place more and more demands on Internet bandwidth. Thus, it will be important to distribute files and other data objects as efficiently as possible.

Currently, data objects are distributed to individual network clients upon request. When a data object is requested, it is packaged in a plurality of IP (Internet Protocol) packets and transmitted to the requesting client. If another client requests the same data object, the IP packets are re-transmitted to that client. Thus, each request results in a full re-transmission of the entire data object over the network.

This type of data distribution is very inefficient. The inefficiencies become serious in certain situations where there is a rush to obtain a particular data object that has only recently become available. This situation has been dubbed the Midnight Madness problem because the mad dash for files often takes place late at night or in the early morning when files are first made available. Spikes in Internet activity have been caused by a range of phenomena: popular product releases; important software updates; security bug fixes; the NASA Pathfinder vehicle landing on Mars; the Kasparov vs. Deep Blue chess match; and the Starr report. The danger of such traffic spikes lies not in the data type, but rather in the data distribution mechanism.

The Midnight Madness problem is caused by the Internet's current unicast "pull" model. A TCP (Transmission Control Protocol) connection is established between a single sender and each receiver, then the sender transmits a full copy of the data once over each connection. The sender must send each packet many times, and each copy must traverse many of the same network links. Naturally, the sender and links closest to the sender can become heavily saturated. Nonetheless, such a transmission can create bottlenecks anywhere in the network where over-subscription occurs. Furthermore, congestion may be compounded by long data transfers, either because of large files or slow links.

These problems can be alleviated through the use of IP multicast protocols. IP multicast is a method of distributing data in which the data is sent once from a data server and routed simultaneously to all requesting clients. Using this method, the sender sends each packet only once, and the data traverses each network link only once. Multicast has been commonly used for so-called "streaming" data such as data representing audio or video. Typically, multicast is used to transmit live events such as news conferences or audio from broadcast radio stations.

FIG. 1 shows a network system utilizing IP multicasting. The system includes a data server 10 and a plurality of clients 12 and 13. The system also includes a plurality of routers 14 that route data along different communications links to the receiving clients. In this case, only the five clients referenced by numeral 12 have requested the data stream, while the clients referenced by numeral 13 have not requested the data stream. The data stream is forwarded to the requesting clients 12, as indicated by the shaded arrows. However, the data stream is not forwarded to non-requesting clients 13, thus preserving bandwidth on the links to those clients.

IP multicast provides a powerful and efficient means to transmit data to multiple parties. However, IP multicast is problematic for transfers of data objects which must be transmitted reliably, such as files. IP multicast provides a datagram service—"best-effort" packet delivery. It does not guarantee that packets sent will be received, nor does it ensure that packets will arrive in the order they were sent.

Many reliable file transfer protocols have been built on top of multicast. However, since scalability was not a primary concern for most of these protocols, they are not useful for the midnight madness problem. The primary barrier to scalability is that most of these protocols require feedback from the receivers in the form of acknowledgements (ACKs) or negative acknowledgements (NACKs). If many receivers generate feedback, they may overload the source or intermediate data links with these acknowledgements.

A so-called data carousel protocol can be used to provide scalable file distribution using multicast protocols. A data carousel is a simple protocol that avoids feedback from receivers. Using this protocol, a data server repeatedly sends the same data file using IP multicast. If a receiver does not correctly receive part of the file, the receiver simply waits for that portion of the file to be transmitted again.

Although a data carousel is workable, it often imposes a significant delay as the receiver waits for the next iteration of the file transmission. Forward Error Correction (FEC) can be utilized in conjunction with a data carousel to reduce the re-transmission wait time. Using FEC, error correction packets are included in the data stream. The error correction packets allow reconstruction of lost packets without requiring a wait for the next file transmission.

Using IP multicast, corrupted packets are automatically detected (using checksums) and discarded by the IP protocol. Accordingly, it is only necessary to replace lost packets. Therefore, the FEC protocol described herein deals only with erasure correction rather than with error correction, even though the broader terms "error correction" and "FEC" are used throughout the description.

Using forward error correction, a data object is broken into data blocks for transmission in respective IP packets. Assuming that there are k source blocks, these source blocks are encoded into n erasure-encoded blocks of the same size, wherein n>k, in a way that allows the original k source blocks to be reconstructed from any k of the erasure-encoded blocks. This is referred to as (n,k) encoding. Many (n,k) encoding techniques are based on Reed-Solomon codes and are efficient enough to be used by personal computers. See Rizzo, L., and Vicisano, L., "Effective Erasure Codes for Reliable Computer Communication Protocols", *ACM SIGCOMM Computer Communication Review*, Vol. 27, No. 2, pp. 24–36, Apr. 1997, and Rizzo, L., and Vicisano, L., "Reliable Multicast Data Distribution Protocol-Based on Software FEC Techniques", *Proceedings of the Fourth IEEES Workshop on the Architecture and Implementation of High Performance Communication Systems*, HPCS'97, Chalkidiki, Greece, June 1997, for examples of an (n,k) encoding method. So-called Tornado codes are viable alternatives to Reed-Solomon codes.

It is desirable in many situations to utilize systematic (n,k) encoding, in which the first k of the n encoded blocks are the original data blocks themselves. If no blocks are lost during transmission, a receiver does not incur any processing overhead when decoding the k blocks of a systematic code. The methods described herein work with, but do not require, systematic encoding.

FIG. 2 shows how this scheme works. A data file in this example contains k blocks, indicated by reference numeral 20. These k blocks are encoded in a step 21 using a Reed-Solomon encoding algorithm, resulting in n erasure-encoded blocks 22, which are sent repeatedly in a step 23 using IP multicast. Each of the n erasure-encoded blocks is the same size as one of the original k blocks. The receiver waits until it has received any k of the erasure-encoded blocks (indicated by reference numeral 24), and then decodes them in a step 25 to recreate the original k source blocks 26.

In practice, k and n are limited when using Reed-Solomon-based codes, because encoding and decoding with large values becomes prohibitively complex. Typical limits are k=64 and n=255.

Because most files are larger than k blocks (assuming k has been limited to some pre-defined maximum), such files are broken into erasure correction (EC) groups, each group representing k blocks of the original data file. Erasure correction is performed independently for each group. Thus, the k blocks of each group are encoded into n erasure-encoded blocks. Each erasure-encoded block is identified by an index relative to its group, specifying which of the n encoded blocks it is, as well as a group identifier associating it with a particular EC group. The index and group identifiers are packaged with the block in a header that prepends the data itself. The data and header are packaged in an IP packet and transmitted using the multicast and data carousel techniques already described.

When using EC groups in this manner, the order of block transmission affects the time required to reconstruct a data object. Suppose, for example, that all n erasure-encoded blocks are sent from one group before sending any from the next group. Receivers with few losses are forced to receive more blocks than they actually need. To avoid this, the data server sends the first block (having index=1) from every group, then the next block (having index=2) from every group, and so on.

This is illustrated in FIG. 3, in which each group 30 is shown as a row of erasure-encoded blocks 32. The arrows show the order of block transmission, from left to right. Upon transmission of block n of the last group, transmission begins again with the first block of the first group.

To complete the reception, a receiver must receive k distinct erasure-encoded blocks (i.e. with different index values) from each group. For some groups, more than k blocks may be received, in which case the redundant blocks are discarded. These redundant blocks are a source of inefficiency, as they increase the overall reception time. Supposing that only one additional block is needed to complete the reception, it is possible that a receiver may have to wait an entire cycle of G blocks (receiving blocks from all other groups) before obtaining another block from the desired group. Thus, the inefficiency is related to the number of groups G, which is equal to the number of blocks in the file divided by k.

One danger with this transmission order is that a pattern of periodic network losses may become synchronized with the transmission so as to always impact blocks from certain groups; in the worst case, a single group is always impacted. One solution to this potential problem is to randomly permute the order of groups sent for each index value, thereby spreading periodic losses randomly among groups.

During the reception process, a client buffers incoming blocks as they are received. If enough RAM is available, the blocks are received, sorted, and decoded in main memory before being written to disk. For larger files, a client simply writes all blocks to disk in the order they are received, discarding any blocks over k that are received for a particular group. When reception is complete (i.e., k blocks have been received for each group), the blocks are sorted into groups and then decoded. This method of writing to disk imposes a delay as the file is sorted and decoded. This delay can be minimized to some extent by partial sorting of the blocks before writing them to disk. However, disk I/O can quickly become a bottleneck under this approach. Because there is no mechanism to slow down the sender, allowing the transmission rate to outpace disk writes results in wasted network bandwidth. With next generation networks running at 100 Mbps, and disks running much slower, this can be a serious problem. Furthermore, random disk writes can be ten times slower than sequential disk writes.

The prior art methods described above provide workable solutions to the challenging of distributing popular data objects to a plurality of network clients, while making efficient use of available bandwidth. However, the prior art does not describe an actual embodiment of a system in which these methods are used. In developing such an embodiment, the inventors have developed certain improvements which increase the efficiency and usefulness of the multicast file distribution using data carousel and erasure correction techniques.

SUMMARY

The invention embodiments described below utilize (n,k) encoding for use in a data carousel in conjunction with IP multicasting. It is assumed that k is limited to some practical maximum value $k_{max}$. To determine an actual value of k to use for a particular file transmission, a sender determines the number of groups G that would be required if k was selected to equal $k_{max}$, in accordance with the integer expression G=ceiling(S/$k_{max}$). The sender then determines the minimum value of k that would produce no more than G groups: $k_{min}$=ceiling (S/G). When configuring groups for encoding and transmission, no more than $k_{min}$ data object blocks are represented within each group of erasure-encoded blocks.

DETAILED DESCRIPTION

Network and Computer Architecture

Figure 1:
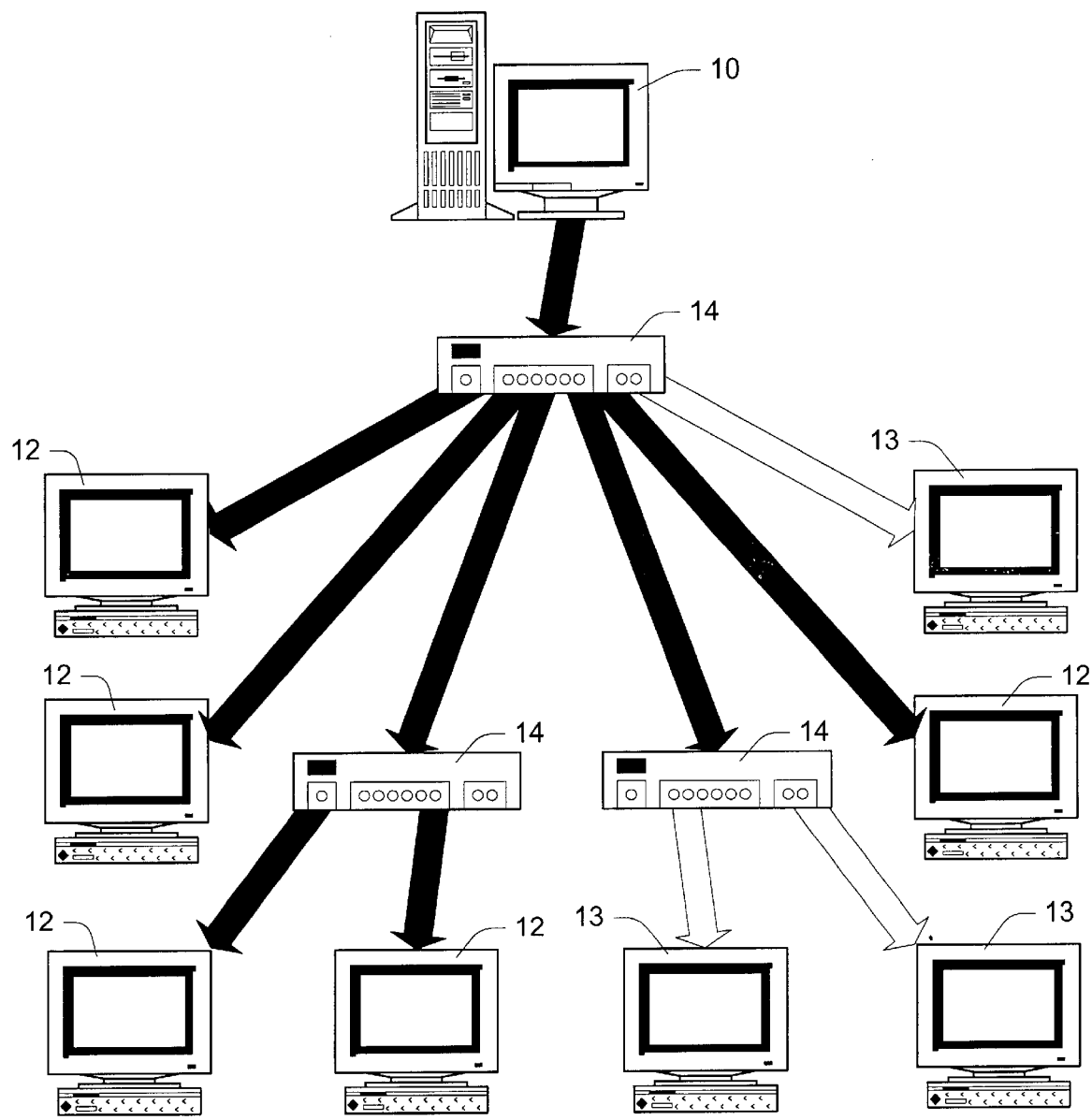
FIG. 1 is a block diagram of a computer network system, illustrating the use of multicast network distribution.
Figure 2:
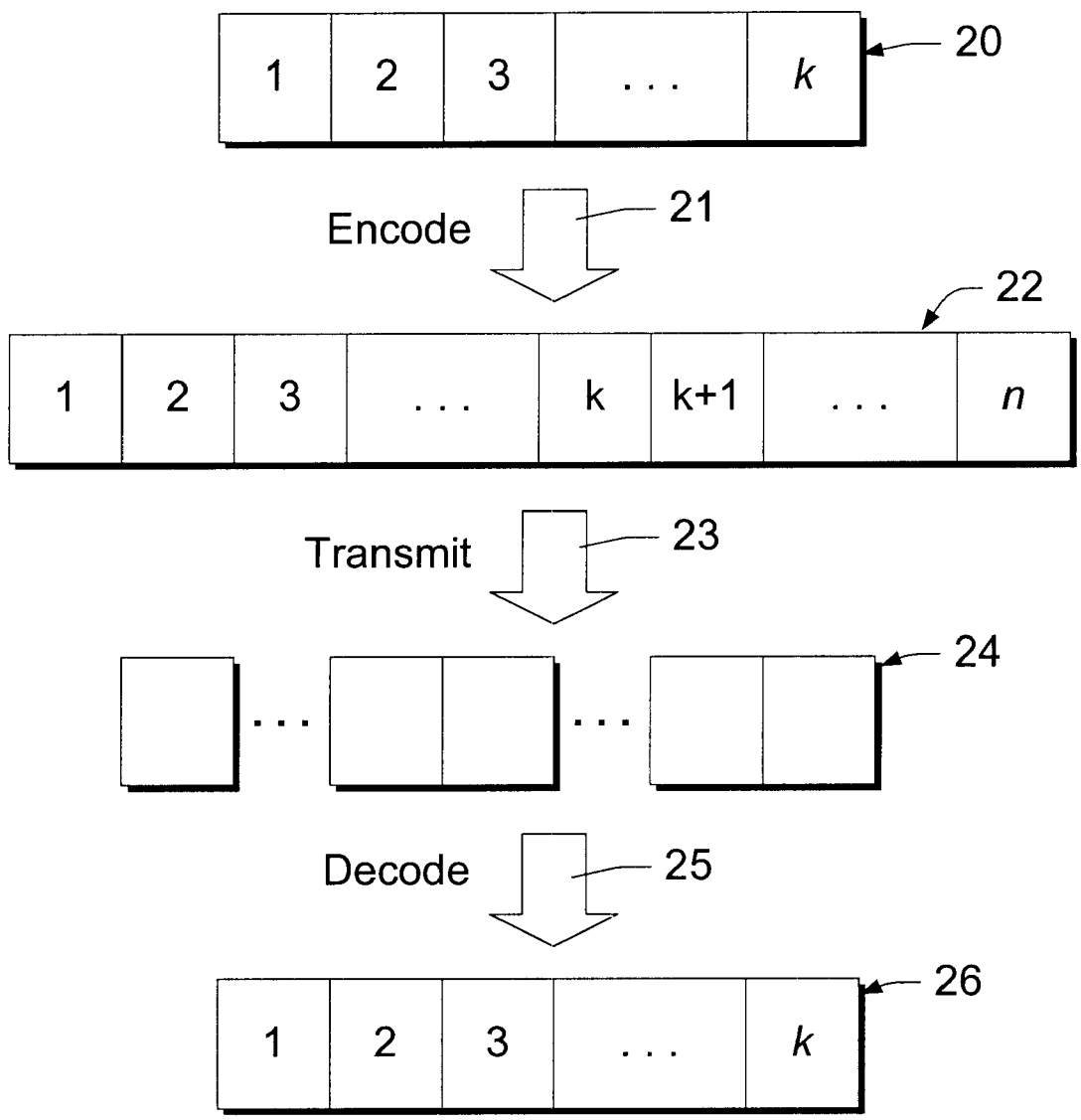
FIG. 2 is a block diagram showing the use of forward error correction in distributing data objects.
Figure 3:
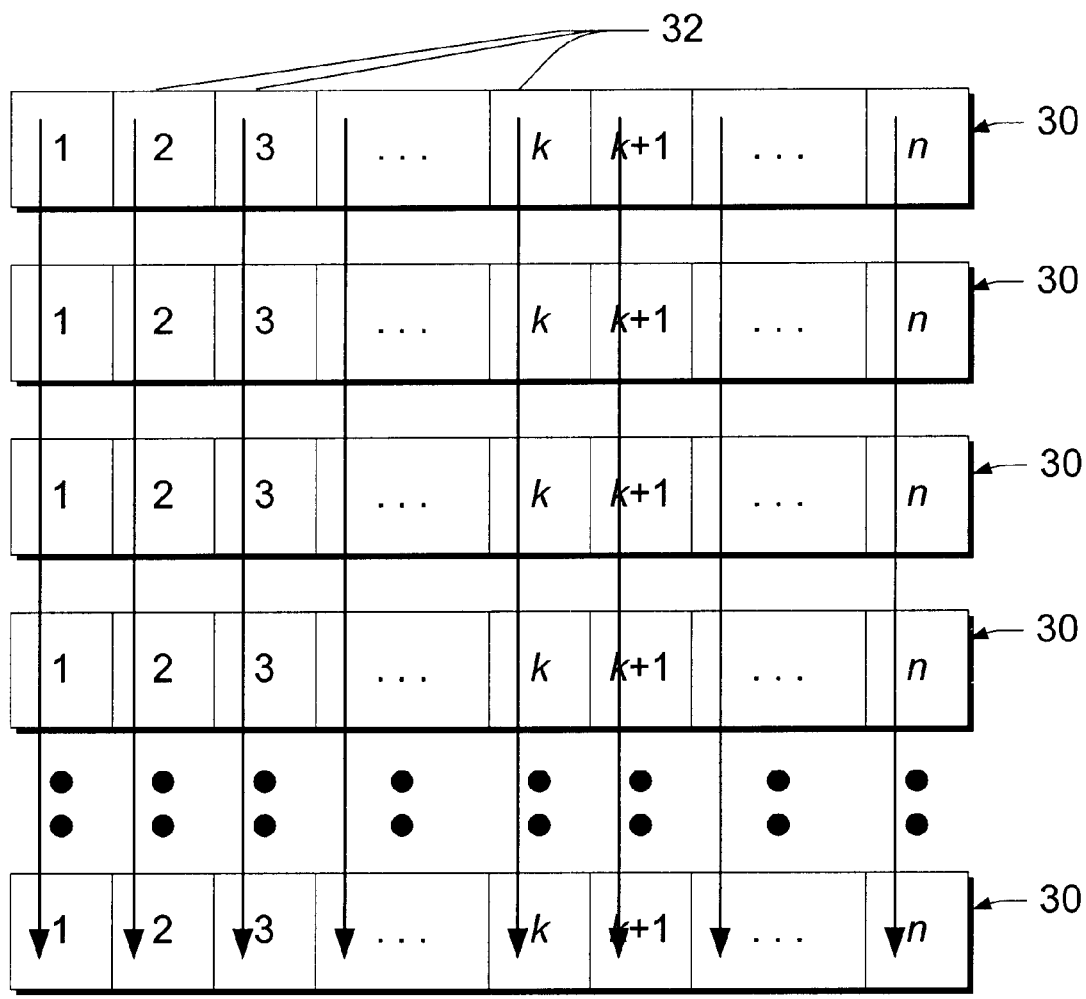
FIG. 3 is a block diagram showing the use of a data carousel in conjunction with forward error correction.
Figure 4:
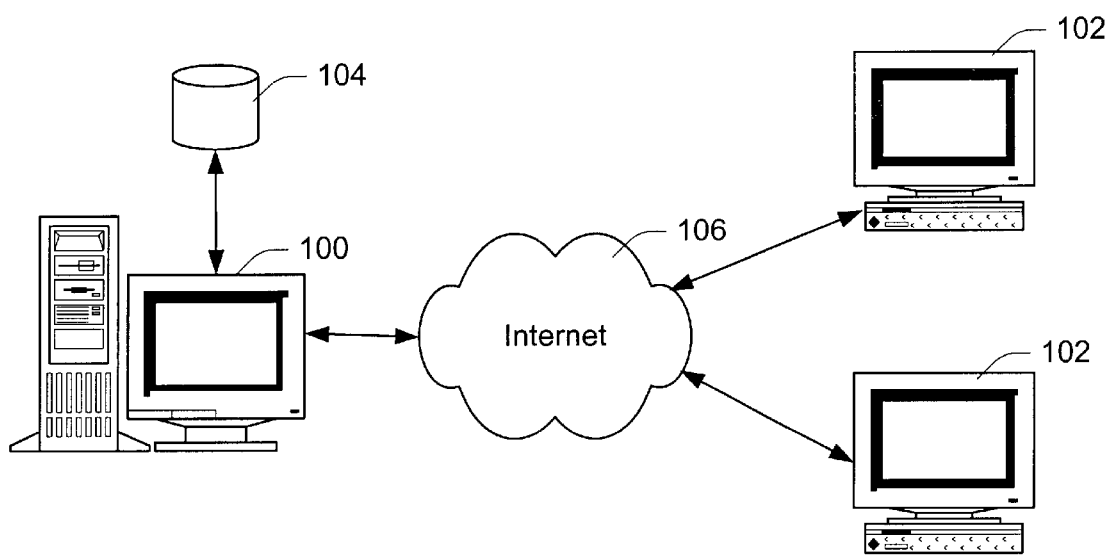
FIG. 4 is a block diagram showing a computer network system in accordance with the invention.

FIG. 4 shows a computer network comprising a data server 100 and a plurality of network clients 102. The data server has access to one or more data objects 104 such as files, program objects, etc. Such objects are typically located on a hard disk storage medium of the server itself or on disk storage controlled by another network-accessible computer. The clients 102 are connected to communicate with the data server 100 using an IP (Internet Protocol) communications medium 106 such as the public Internet or some other wide-area or local-area network.

Figure 5:
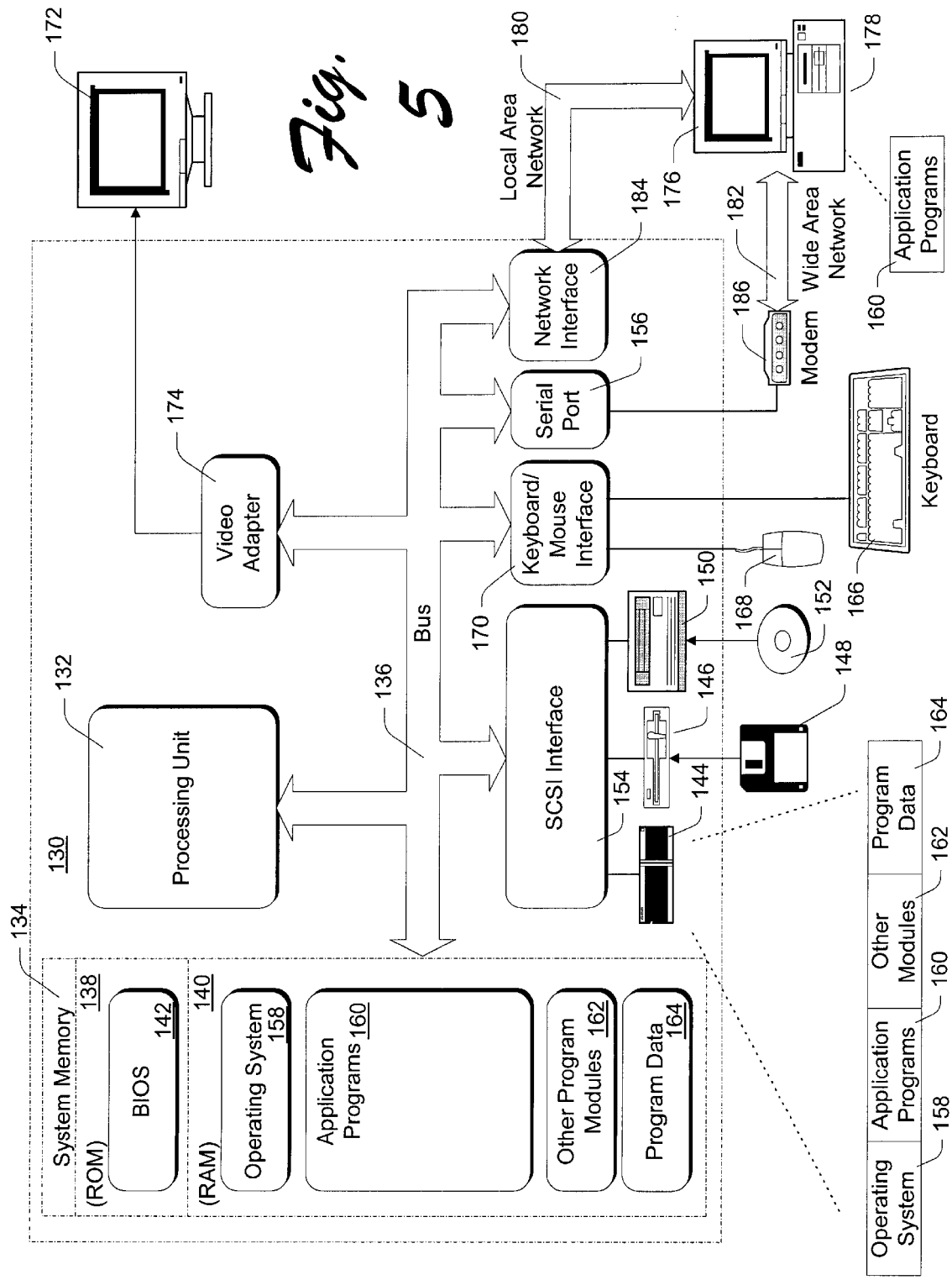
FIG. 5 is a block diagram of an exemplary computer for use in conjunction with the invention.

FIG. 5 show a general example of a desktop computer 130 that can be used to implement data server 100 and/or network clients 102. Computer 130 includes one or more processors or processing units 132, a system memory 134, and a bus 136 that couples various system components including the system memory 134 to processors 132. The bus 136 represents one or more of any of several types of bus structures, including a memory bus or memory controller, a peripheral bus, an accelerated graphics port, and a processor or local bus using any of a variety of bus architectures. The system memory 134 includes read only memory (ROM) 138 and random access memory (RAM) 140. A basic input/output system (BIOS) 142, containing the basic routines that help to transfer information between elements within computer 130, such as during start-up, is stored in ROM 138.

Computer 130 further includes a hard disk drive 144 for reading from and writing to a hard disk (not shown), a magnetic disk drive 146 for reading from and writing to a removable magnetic disk 148, and an optical disk drive 150 for reading from or writing to a removable optical disk 152 such as a CD ROM or other optical media. The hard disk drive 144, magnetic disk drive 146, and optical disk drive 150 are connected to the bus 136 by an SCSI interface 154 or some other appropriate interface. The drives and their associated computer-readable media provide nonvolatile storage of computer-readable instructions, data structures, program modules and other data for computer 130. Although the exemplary environment described herein employs a hard disk, a removable magnetic disk 148 and a removable optical disk 152, it should be appreciated by those skilled in the art that other types of computer-readable media which can store data that is accessible by a computer, such as magnetic cassettes, flash memory cards, digital video disks, random access memories (RAMs), read only memories (ROMs), and the like, may also be used in the exemplary operating environment.

A number of program modules may be stored on the hard disk 144, magnetic disk 148, optical disk 152, ROM 138, or RAM 140, including an operating system 158 (e.g., the server operating system 20), one or more application programs 160, other program modules 162, and program data 164. A user may enter commands and information into computer 130 through input devices such as a keyboard 166 and a pointing device 168. Other input devices (not shown) may include a microphone, joystick, game pad, satellite dish, scanner, or the like. These and other input devices are connected to the processing unit 132 through an interface 170 that is coupled to the bus 136. A monitor 172 or other type of display device is also connected to the bus 136 via an interface, such as a video adapter 174. In addition to the monitor, personal computers typically include other peripheral output devices (not shown) such as speakers and printers.

Computer 130 commonly operates in a networked environment using logical connections to one or more remote computers, such as a remote computer 176. The remote computer 176 may be another personal computer, a server, a router, a network PC, a peer device or other common network node, and typically includes many or all of the elements described above relative to computer 130, although only a memory storage device 178 has been illustrated in FIG. 5. The logical connections depicted in FIG. 5 include a local area network (LAN) 180 and a wide area network (WAN) 182. Such networking environments are commonplace in offices, enterprise-wide computer networks, intranets, and the Internet.

When used in a LAN networking environment, computer 130 is connected to the local network 180 through a network interface or adapter 184. When used in a WAN networking environment, computer 130 typically includes a modem 186 or other means for establishing communications over the wide area network 182, such as the Internet. The modem 186, which may be internal or external, is connected to the bus 136 via a serial port interface 156. In a networked environment, program modules depicted relative to the personal computer 130, or portions thereof, may be stored in the remote memory storage device. It will be appreciated that the network connections shown are exemplary and other means of establishing a communications link between the computers may be used.

Generally, the data processors of computer 130 are programmed by means of instructions stored at different times in the various computer-readable storage media of the computer. Programs and operating systems are typically distributed, for example, on floppy disks or CD-ROMs. From there, they are installed or loaded into the secondary memory of a computer. At execution, they are loaded at least partially into the computer's primary electronic memory. The invention described herein includes these and other various types of computer-readable storage media when such media contain instructions or programs for implementing the steps described below in conjunction with a microprocessor or other data processor. The invention also includes the computer itself when programmed according to the methods and techniques described below.

For purposes of illustration, programs and other executable program components such as the operating system are illustrated herein as discrete blocks, although it is recognized that such programs and components reside at various times in different storage components of the computer, and are executed by the data processor(s) of the computer.

Data Object Distribution

The data server or sender 100 is configured to continuously send data object 104 to any requesting clients or receivers 102, using a multicast IP data carousel in conjunction with (n,k) erasure correction, generally as described above in the "Background" section of this document. Specifically, the data server transmits the data object to the network clients as a plurality of erasure-encoded blocks in a multicast data carousel, each erasure-encoded block being packaged in a respective multicast IP packet, with a self-describing header. Even more specifically, the data server breaks the data object into G groups of source blocks, each group having no more than k source blocks. The value k is predetermined in order limit the complexity of computations and to keep such computations within the capabilities of available computer hardware and software.

From the k source blocks of each group, the data server computes n erasure-encoded blocks in accordance with a known (n,k) encoding method such as a Reed-Solomon encoding method. The n erasure-encoded blocks preferably include the original k source blocks. As described above, the k erasure-encoded blocks have sizes that are equal to the sizes of the original k source blocks. As also described, the original k source blocks can be decoded from any k of the erasure-encoded blocks.

Using this scheme, a single sender (data server 100) initiates the transfer of a single file to a multicast address. The sender loops continuously either ad infinitum, or until a certain amount of FCE redundancy has been achieved. Receivers (network clients 102) tune in to the multicast address and cache received packets in a temporary file until the client receive enough blocks to recreate the file. Receivers may then drop out of the multicast, or they continue to receive blocks in anticipation of the next file to be sent. In either case, the file is then decoded, and the file name and attributes set.

When sending, the data server can either read the original file and compute the erasure-encoded blocks on the fly, or the erasure-encoded blocks can be precomputed and stored on disk. The choice of which method to use involves a tradeoff between disk storage and processor utilization.

Selecting k

Assuming that the original data object contains S blocks, the number of groups G will be equal to S/k if S is evenly divisible by k, or S/k+1 if S is not evenly divisible by k (assuming the use of integer division). This is expressed as G=ceiling(S/k), where the function "ceiling( )" performs a mathematical operation of rounding up to the closest integer. From this expression, it is clear that increasing k reduces the number of groups G. Reducing G in turn produce more efficient data transmission. The most efficient choice would be to set k to the number of blocks S in the original file, whereupon G would equal one. As mentioned above, however, a large k tends to complicate both encoding and decoding operations. In the described embodiment, k is limited to $k_{max}=64$.

For purposes of explanation, assume that $k_{max}=8$, and that a data object has S=9 data blocks. The number of groups in this example will be two: $G=ceiling(S/k_{max})=2$.

Figure 6:
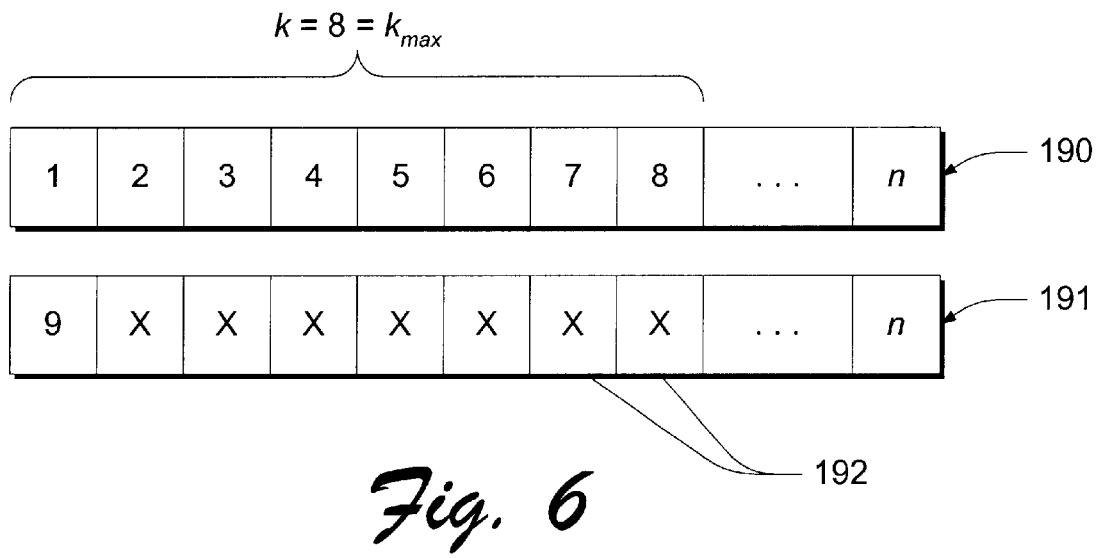
FIG. 6 is a block diagram showing a prior art method of organizing erasure-encoded blocks in groups.

FIG. 6 shows two groups 190 and 191 and their erasure-encoded blocks 192, assuming that $k=k_{max}=8$. Note that the second group requires seven empty placeholder or padding blocks (indicated by Xs within the blocks). In this extreme example, the wasted overhead of these seven padding blocks is nearly 50%.

In accordance with the invention, k is chosen for a particular data object based on $k_{max}$ and on the actual number of blocks S in the original data object, in a way that reduces the wasted overhead of padding blocks.

Figure 7:
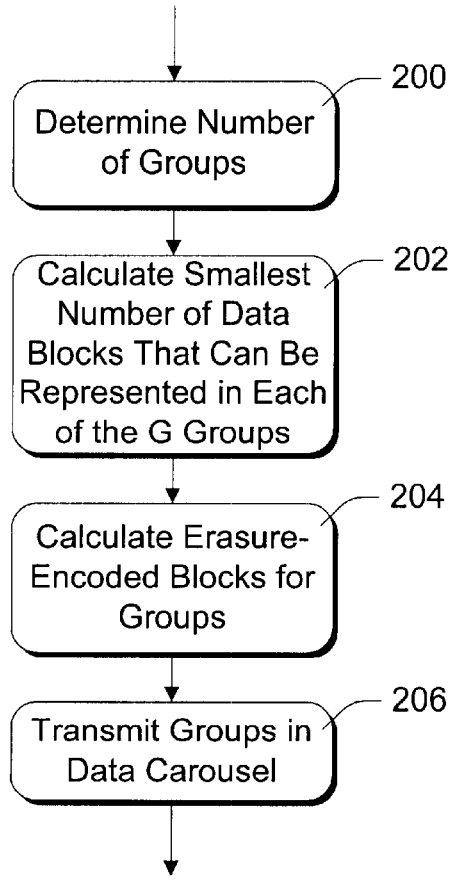
FIG. 7 is a flowchart showing steps in accordance with the invention for sending a data file using a data carousel in conjunction with forward error correction.

FIG. 7 shows a method of transmitting a data object in accordance with the invention, including steps that select the number of data object blocks k to be included in each group of erasure-encoded blocks. A step 200 comprises determining the minimum number of groups G of erasure-encoded blocks that can represent the S data object blocks, so that each group of erasure-encoded blocks represents no more than $k_{max}$ data object blocks. In the described embodiment, this step comprises evaluating the integer expression $G=ceiling(S/k_{max})$.

A subsequent step 202 comprises determining the smallest number of data object blocks $k_{min}$ that can be represented in each group while still requiring no more than G groups of erasure-encoded blocks to represent the S data object blocks. In the described embodiment, this step comprises evaluating the integer expression $k_{min}=ceiling(S/G)$.

In accordance with this aspect of the invention, no more than $k_{min}$ data object blocks are represented within each group of erasure-encoded blocks. For the example discussed above, in which S=9 and $k_{max}=8$, G will be 2 and $k_{min}$ will be 5 (using the equations above). Assuming that the same value of k is used in every group, each group will use a $k=k_{min}=5$.

Step 204 is FIG. 7 comprises calculating the n erasure-encoded data blocks for each group G.

Step 206 comprises transmitting the erasure-encoded blocks of the groups in a data carousel over a network for reception by multiple network receivers.

Figure 8:
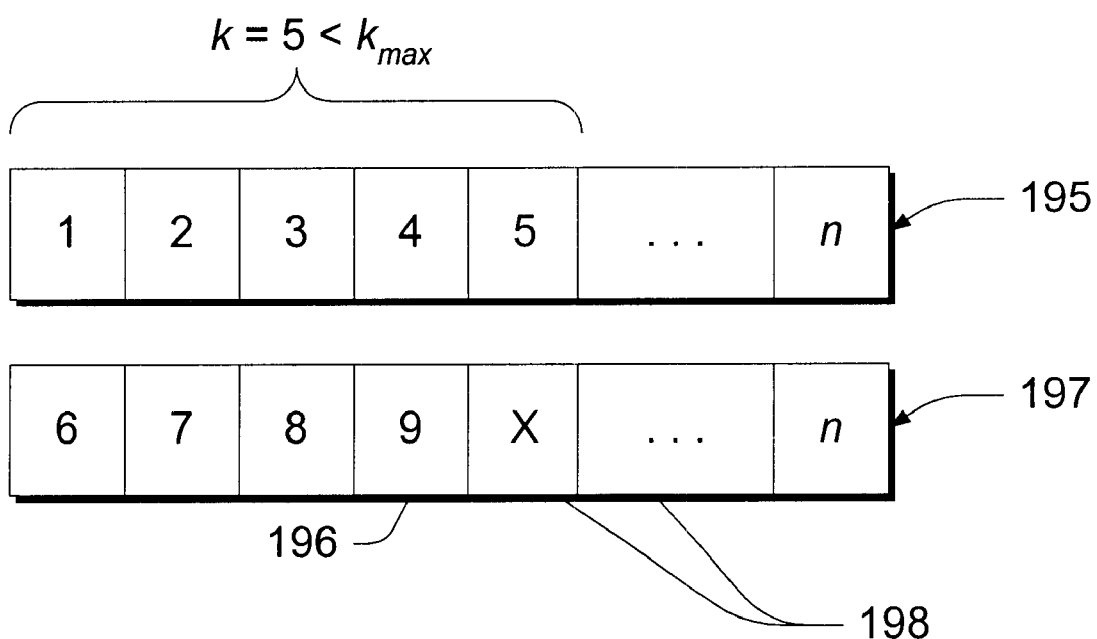
FIG. 8 is a block diagram showing groups of a data carousel in accordance with the invention.

The result is illustrated in FIG. 8, in which the first of two groups 195 has five data object blocks 196 corresponding to the first k=5 data blocks of the original data object, and the second of the two groups 197 has the remaining four data object blocks 196 of the original data object plus a single placeholder data block 198.

Steps 200, 202, and 204 allow k to be reduced in situations where doing so does not increase the overall number of groups G. This increases the efficiency of carousel transmission. In accordance with one embodiment of the invention, these steps are performed only where S is greater than $k_{max}$ and less than $k_{max}^2$. If S is less than or equal to $k_{max}$, G will be equal to 1, and $k_{min}$ is set to S. Otherwise, if G is greater than or equal to $k_{max}$ the value of $k_{min}$ is set to $k_{max}$.

In one embodiment, k is the same for all groups used to transmit a data object. However, it might be desirable to vary k for each group. In the example above, for instance, the single placeholder blocks can be eliminated entirely by using k=5 in the first group and k=4 in the second group. In each case, k is kept at or below the calculated $k_{min}$. Thus, one embodiment of the invention might vary k between groups. In the described embodiment, a header associated with each data block indicates the particular value of k used in the group with which the data block is associated.

Receiving and Decoding

In implementing the encoding and transmission scheme described above, it has been found that disk performance can become a bottleneck when receiving and decoding a data object. If received packets cannot be written to disk as quickly as they are received, they must be discarded—there is no way to instruct the server to slow the data transmission.

The task of efficiently writing received packets to disk is complicated by the round-robin transmission scheme described above, in which erasure-encoded blocks are sent out-of-order. Furthermore, in an IP network, packets may arrive in to an order that is different from the transmission order. Additionally, certain blocks might not be received at all, and redundant blocks are to be ignored.

Generally, a receiver in accordance with the invention is designed to reconstruct a data object regardless of the sender's block transmission order and regardless of whether certain blocks are missing from the received data stream. The receiver does this by accumulating erasure-encoded blocks for respective groups. When k blocks have been received for a particular group, any further received blocks for that group are ignored and discarded. In addition, any new copy of a block that has previously been received is ignored and discarded. Each block is accompanied by a header structure that indicates the group to which the block belongs and the block position (index) within that group.

FIGS. 9–12 show how erasure-encoded blocks are received, stored, and decoded in one embodiment of the invention. In the following figures, erasure-encoded blocks are shown as hatched rectangles. Decoded data blocks are shown as solid-shaded rectangles. Empty rectangles indicate reserved disk or memory space.

Figure 9:
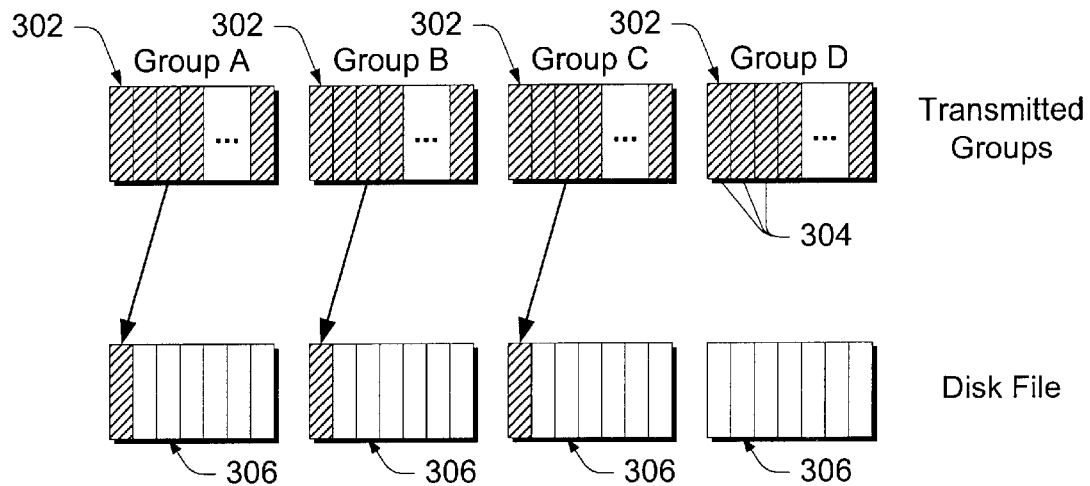
FIGS. 9–12 are block diagrams illustrating a method of receiving, caching, and decoding erasure-encoded blocks in accordance with one embodiment of the invention.

Referring to FIG. 9, a transmission stream includes a number of groups 302, each of which includes n erasure-encoded blocks 304. The erasure-encoded blocks within a single group represent contiguous data blocks of the original data object—any k of the erasure-encoded blocks can be used to reconstruct k data blocks of the original file. Erasure-encoded blocks of respective groups are transmitted non-contiguously. Specifically, the blocks are transmitted in a round-robin fashion: a block from the first group, then a block from the next group, and so on.

As an initialization step, the receiver allocates secondary storage for a data object or file that is to be received using the FEC data carousel described above. This disk space is shown at the bottom of FIG. 9. In this step, the receiver allocates a space on its hard disk that will eventually contain the received and decoded file. The receiver further determines group locations 306 within the allocated disk space. Each group location corresponds to a respective one of groups 302 of the transmitted data stream, and will eventually hold the decoded data blocks represented by the corresponding group.

Each vertical arrow in FIG. 9 represents the transmission and reception of a single erasure-encoded data block. Transmission and reception proceed in a round-robin fashion, with one block from Group A, then a block from Group B, and so on. FIG. 9 shows the transmission and reception of three erasure-encoded blocks, from Group A, Group B, and Group C consecutively. In this example, reception begins with the first group, but with the third block within that group.

Figure 10:
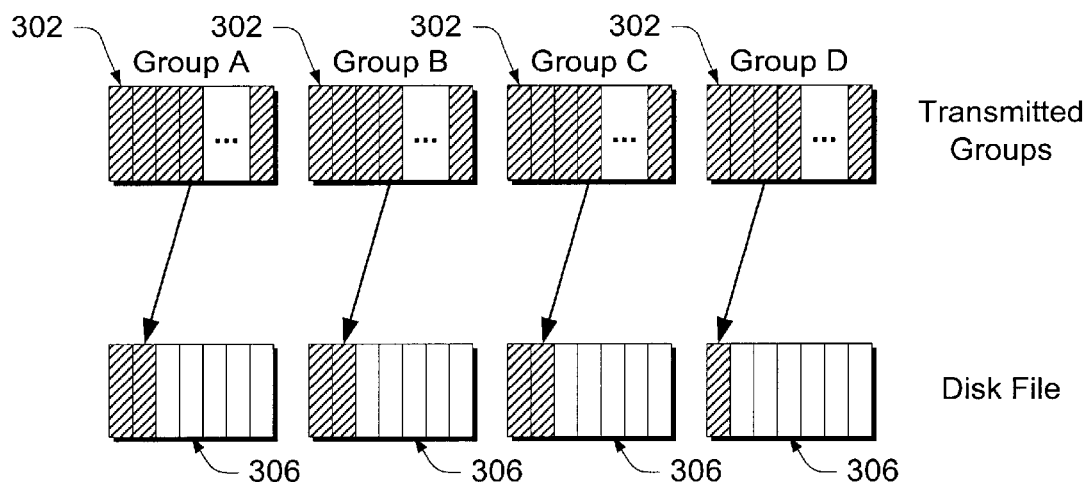

Note that FIGS. 9 and 10 show a situation in which blocks are received in an orderly fashion from one group to the next and from one position to the next within each group. In a more practical example, data losses might disrupt this regular order. In addition, randomizing group order in each round of transmission would further disrupt the regular order shown. Regardless, the receiver simply stores each received block in its corresponding group location until k blocks have been received for each group, and disregards any blocks belonging to groups for which k blocks have already been received.

As the erasure-encoded blocks are received, they are segregated by group on disk. More specifically, the blocks of any particular group are stored as they are received at the location on disk that has been allocated for that particular group. Within each group, the blocks are stored in the order received—no attempt is made to sort or decode the erasure-encoded blocks within each group.

FIG. 10 shows four more erasure-encoded blocks being transmitted, received, and written to disk. The indicated blocks are transmitted in the order shown, from left to right. As each new block is received, it is written to its corresponding group location on disk, without sorting.

Figure 11:
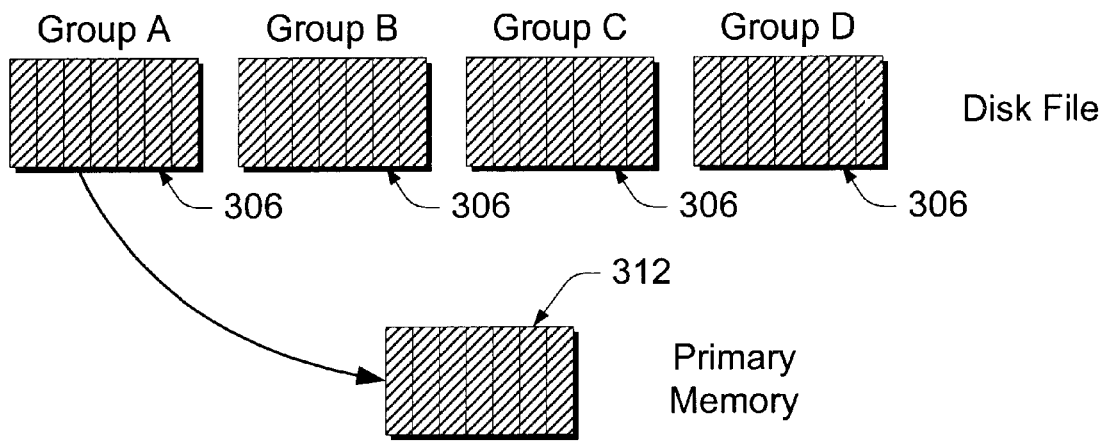

Reception is complete when k blocks have been received for each group. This is illustrated in FIG. 11, in which each of the group locations 306 in secondary storage has been filled. After storing k blocks for each group, each group is sorted and decoded individually. Specifically, each group is read into a RAM buffer 312 or other primary memory buffer from secondary storage. This is indicated by the curved arrow of FIG. 11. The erasure-encoded blocks of the group are then sorted and decoded to produce the original k source data blocks represented by the group. The decoding is performed in accordance with the particular (n,k) encoding method employed by the sender.

Figure 12:
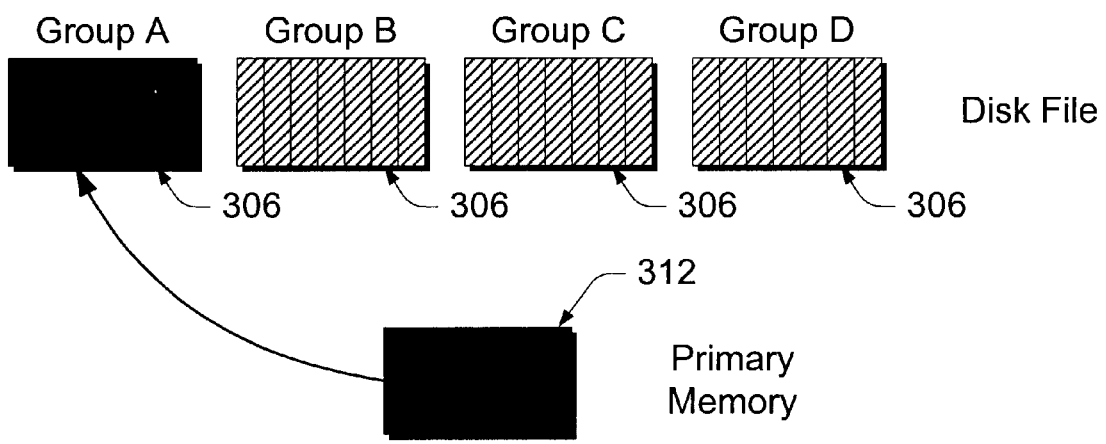

FIG. 12 shows that the blocks of Group A have been decoded in primary memory buffer 312. After decoding, these blocks are written back to their group location 306 on secondary storage, replacing the received k erasure-encoded blocks. The process eventually reconstructs the original file as the blocks of group are decoded.

Figure 13:
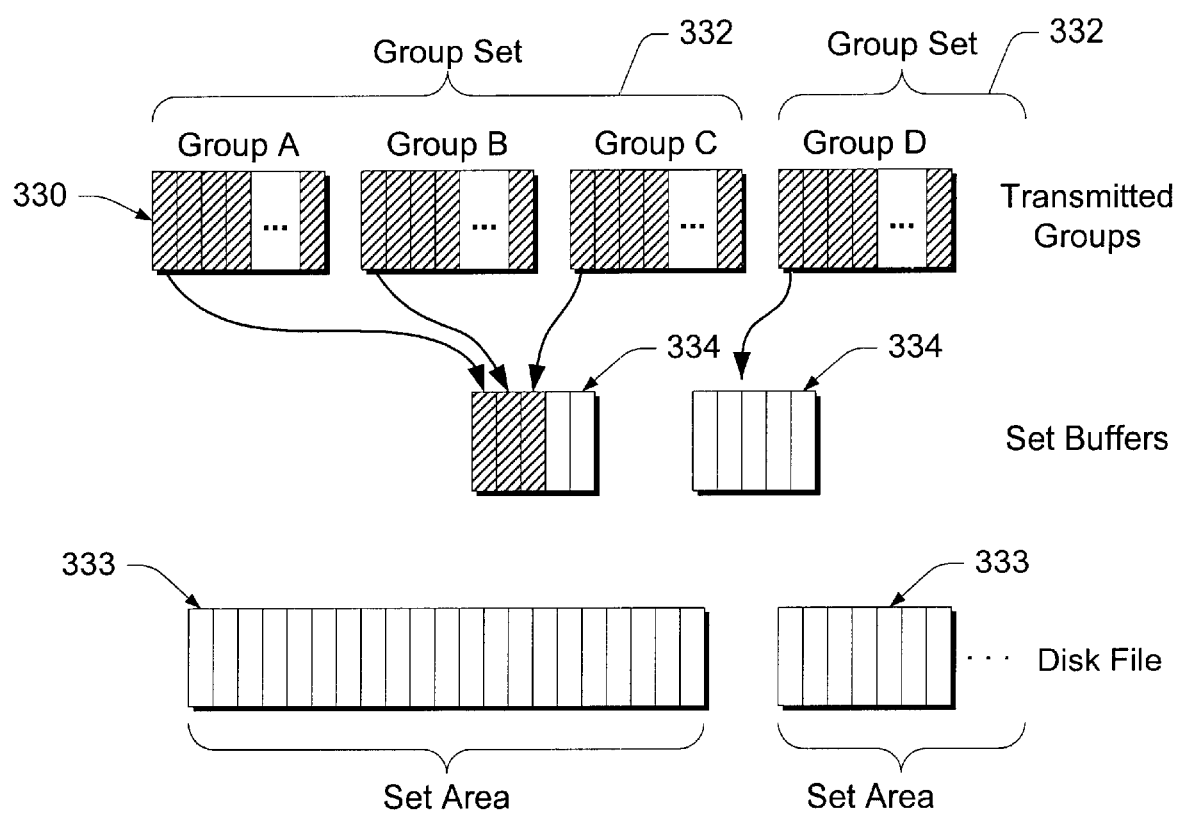
FIGS. 13 and 14 are block diagrams illustrating a method of receiving, caching, and decoding erasure-encoded blocks in accordance with another embodiment of the invention.
Figure 14:
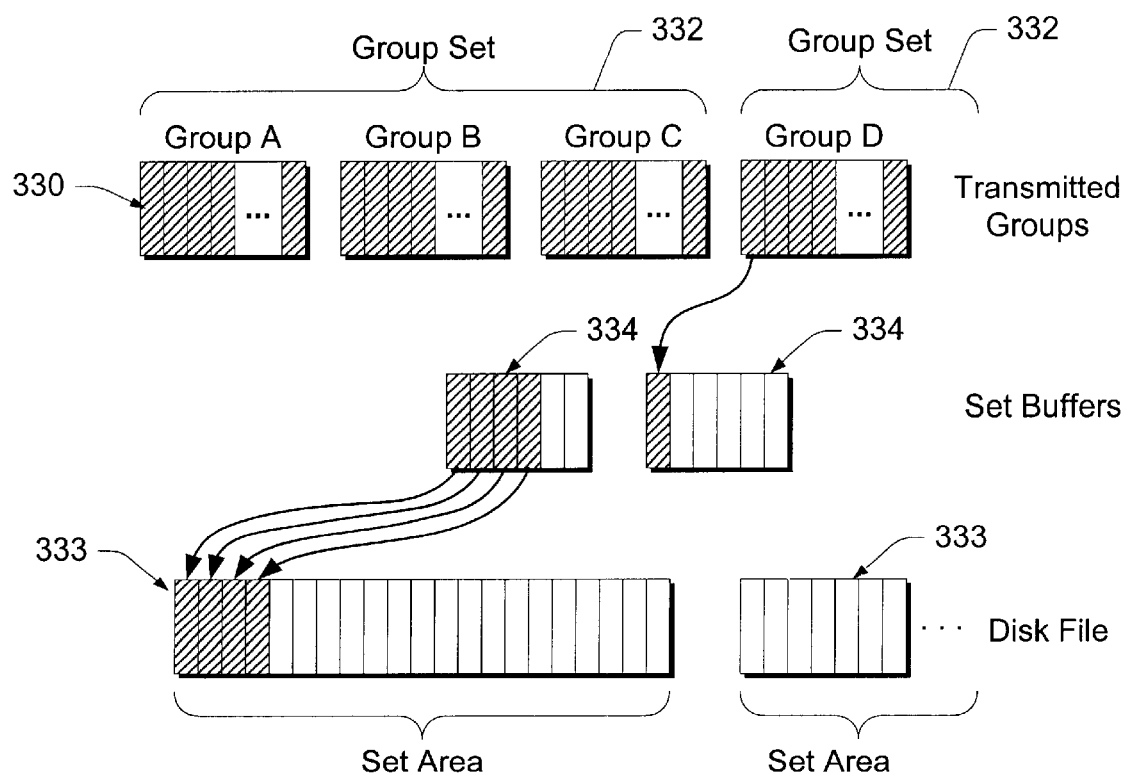

FIGS. 13–14 shows how blocks are received and stored in another embodiment of the invention. In this embodiment, groups 330 are organized in sets of groups 332, wherein each set 332 includes a plurality of contiguous groups 330. Referring to FIG. 13, a first set in this example is formed by Groups A, B, and C. Group D and two following groups (not shown) form a second set.

This organization does not take place at the sender, which sends the individual erasure-encoded blocks in the same order as described above. However, the receiver defines its disk areas in terms of these sets of groups, rather than in terms of individual groups. Thus, the receiver allocates secondary storage for each set of groups and separately identifies an area 333 for each set of groups. When a block is received from a particular set, the block is written to the location of that set on disk—no attempt is made at this point to sort the erasure-encoded blocks or to segregate the blocks by group within each set.

In this embodiment, the receiver maintains one or more primary memory buffers 334 for buffering incoming erasure-encoded blocks. A single buffer is large enough to store a plurality of erasure-encoded blocks, although perhaps not large enough to store an entire set of blocks. The receiver buffers contiguously-received erasure-encoded blocks in a single primary memory buffer 334 as long as the contiguously-received blocks are from a common set of groups. This is shown in FIG. 13, where erasure-encoded blocks from the first set are being written to a first of two available buffers 334. As long as the received blocks are from the same set of groups and the buffer is not full, the blocks are written to buffer 334. Each block is written to the next available position in the buffer. Blocks are disregarded if they are from a group for which k blocks have already been received.

Upon receiving a new erasure-encoded block from a set of groups other than the previous, common set of groups, or upon filling the buffer, the receiver flushes the buffer by writing the buffered blocks to the set area 333 that has already been allocated for the set of groups contained in the buffer. This is shown in FIG. 14, where the buffered blocks are written to their corresponding disk area 333. The buffered blocks are copied to the next available locations in the corresponding disk area without sorting or segregating by block. Thus, the blocks are buffered and stored on disk within each set in the order of their reception.

As the blocks from the first buffer are being copied to disk, the newly-received block, from a different set, is buffered in the second of the two buffers 334. Use of the buffers alternates in this fashion until k blocks have been received for each group of each set.

Once reception is complete (k blocks have been received for each group), the blocks are decoded in a process similar to that shown in FIG. 12, except that sets of groups (rather than individual groups) are read into primary memory, sorted, decoded, and then written back to disk.

Assuming that there are b groups in each set, each buffer is allocated with a size of b blocks. When blocks are received in an orderly fashion from one group to the next, b blocks belonging to a single set of groups will be received together, and a disk write will in most cases be performed only after receiving b blocks. Two buffers work well in this situation—one is used to receive data while the contents of the other is written to disk. However, randomizing the group order in each round of transmission as discussed above will either greatly increase the frequency at which buffers are flushed or will require many more buffers to simultaneously receive blocks from many different sets.

Rather than randomizing group order in this situation, it is preferable to randomly select a starting group for each round, and then complete the round in order. Within each round, a starting group is randomly selected and an erasure-encoded block is transmitted from this group. Transmission then proceeds in group order, with an erasure-encoded block being transmitted from each of the remaining groups. "Group order" is defined to wrap from the last group back to the first group.

When transmitting in this manner, three primary memory buffers work well. Typically, transmission starts with a block from a group that is in the middle of a set. This block and any following blocks from the same set are buffered in a first buffer. When transmission reaches a block from another set, second and third buffers are used alternately to buffer blocks from remaining sets. Finally, the transmission order wraps back to the beginning groups of the initial set, remaining blocks (for the current round) of that set are received in the first buffer, and the first buffer is then flushed as a new round begins into one of the other buffers.

The benefit of this method is fewer, larger writes in place of many small writes, which allows writing to be performed much faster.

Figure 15:
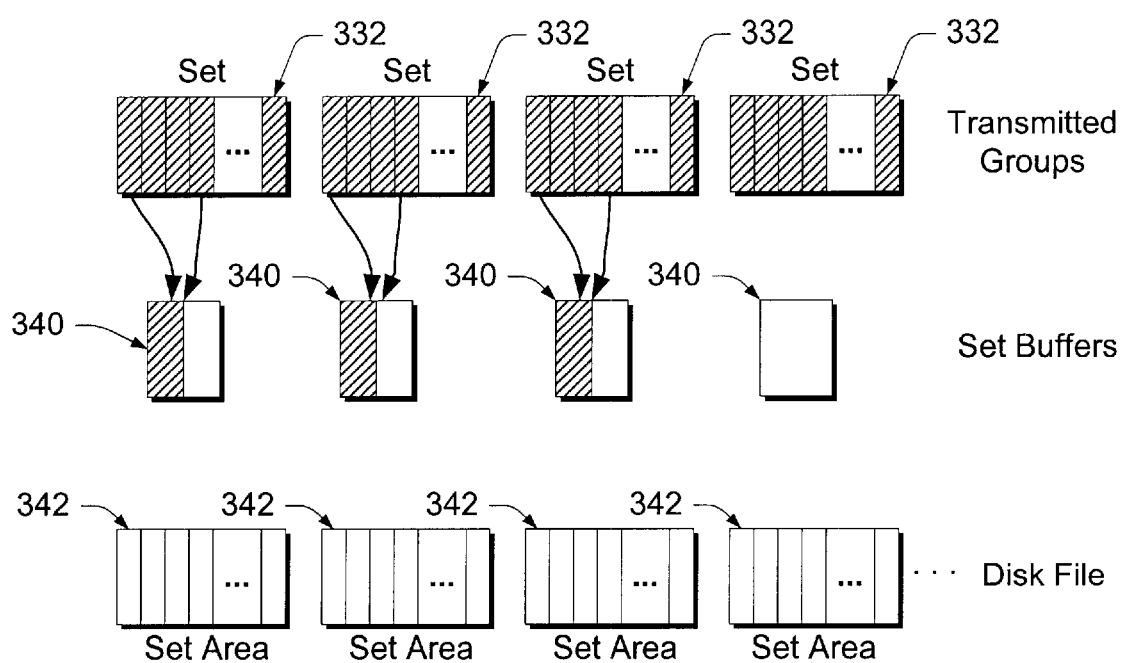
FIGS. 15 and 16 are block diagrams illustrating a method of receiving, caching, and decoding erasure-encoded blocks in accordance with yet another embodiment of the invention.
Figure 16:
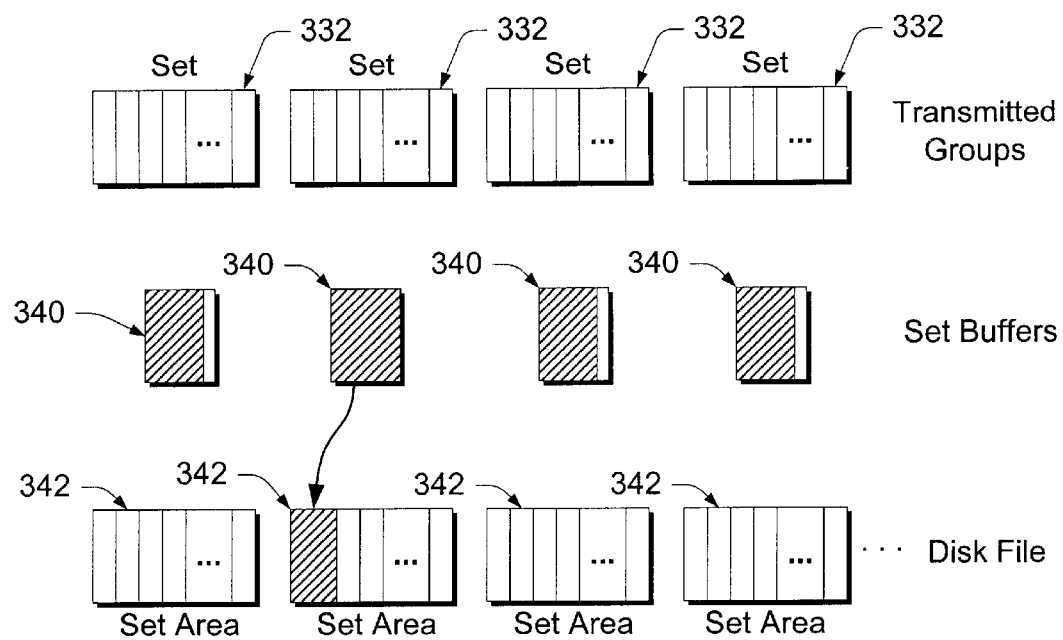

FIGS. 15 and 16 show a variation of the embodiment of FIGS. 13 and 14. In this embodiment, the receiver maintains a buffer 340 for each defined set of the incoming data object. A received erasure-encoded block is buffered in the primary memory buffer corresponding to the set containing the block. Individual buffers are flushed when they become full, by writing their contents to the corresponding set area 342 on disk. Decoding proceeds as in the embodiment of FIGS. 13 and 14. This method does not assume any particular group order, and thereby allows randomization of group order within each round.

Figure 17:
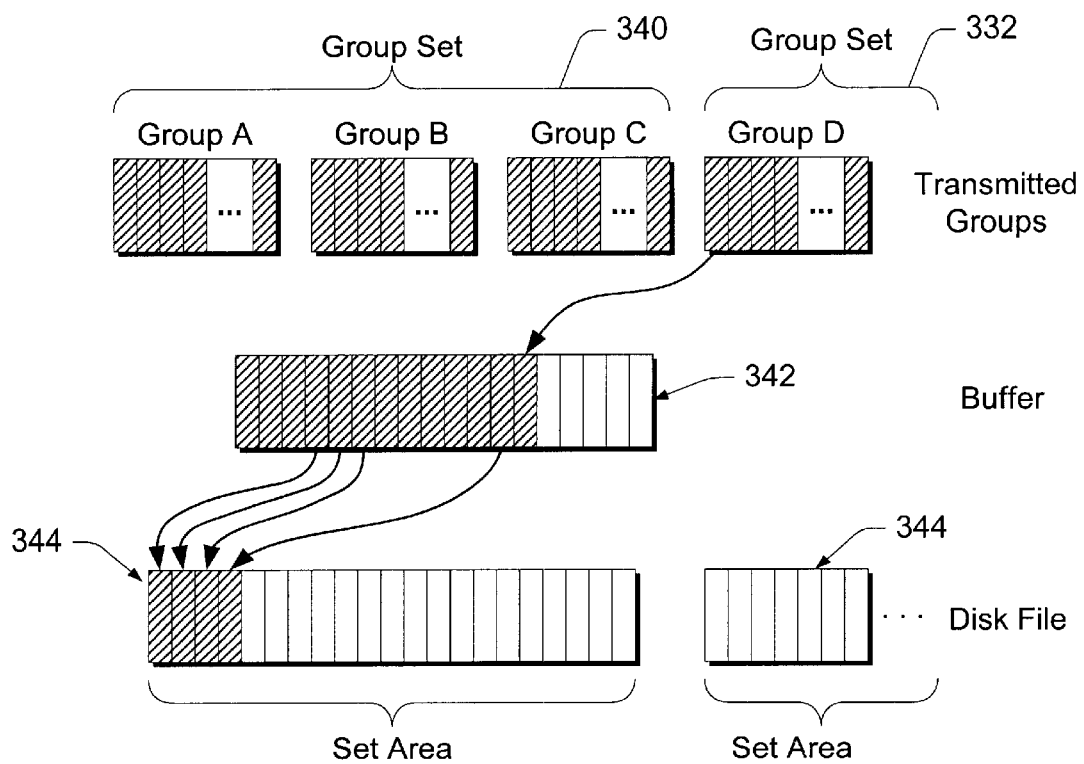
FIG. 17 is a block diagram illustrating a method of receiving, caching, and decoding erasure-encoded blocks in accordance with yet another embodiment of the invention.

FIG. 17 shows yet another scheme for buffering incoming blocks. This scheme is similar to the one described above, in that which the incoming blocks are arranged on disk in sets 340 of groups. However, only a single primary memory buffer 342 is used instead of the multiple buffers 334 indicated in FIG. 16. As blocks are received, they are written to the buffer 342 in any available location. Counts are maintained to indicate the number of currently buffered blocks for each set of groups. Set areas 344 are reserved in secondary storage for eventual storage of blocks belonging to those sets.

In this scheme, disk writes happen repeatedly whenever the system has time to initiate such writes. Each write involves blocks of a single set that have been buffered in memory 342. Prior to a disk write, the system selects a set whose blocks will be written from the primary memory buffer to disk. If any set has b or more buffered blocks in the primary memory buffer, that set is chosen to have its blocks flushed to disk. Otherwise, any set can be chosen to have its blocks flushed to disk. FIG. 17 illustrates a write operation to a first set area. No attempt is made to sort or decode the blocks of a particular set as they are written to disk. Rather, each block is written to the next available location in the disk space reserved for the set.

The value b (the number of groups in a set) is predefined and relates to the size of the primary memory buffer. Specifically, b is chosen so that the size of the primary memory buffer is equal to $bc+b-c+1$ blocks, where c is the number of groups in each set. This relationship between has been found to prevent buffer overflow when using this scheme.

The actual disk write can take place in one of two different ways. Some systems allow so-called "gather writing," in which a single contiguous disk write can utilize data from a number of discontiguous memory blocks. In system such as this, the disk write is specified to utilize the buffer locations having the b buffered blocks. In systems that do not support gather writing, the b blocks are copied to an intermediate memory buffer and then written to disk in a single disk write.

After k blocks have been received and written to disk for each group, each set it read into primary memory, sorted, decoded, and written back to disk.

Session and Meta-file Information

Senders and receivers need to agree on certain session attributes to communicate. Session descriptions might include a multicast address and port number, which might be carried in a session announcement, publicized on a Web page with scheduling information, or conveyed via email or other out-of-band methods.

When files are the objects being transferred, the receiver needs certain metadata in addition to actual file data. Metadata consists of information which is needed or useful for creating a disk file, but which is not part of the file itself; for example, the file name, its creation date, time last modified, file attributes, etc. In many cases, this information is part of a file directory or similar disk organization structure rather than part of the file itself.

In the embodiment described here, metadata is appended to the end of the file as a "trailer" and sent as part of the data carousel. Once the erasure-encoded blocks are decoded, the metadata is extracted and used in creating the actual file structure.

The length of the metadata might vary between files. In the described embodiment, a predefined number of bytes at the end of the file are reserved for a value that indicates the length of the metadata.

Appending the metadata in this manner allows the original file to be reconstructed by simply truncating the file, rather than rewriting it. A checksum is included in the trailer to validate that the file was encoded and decoded correctly.

Packet Headers

Figure 18:
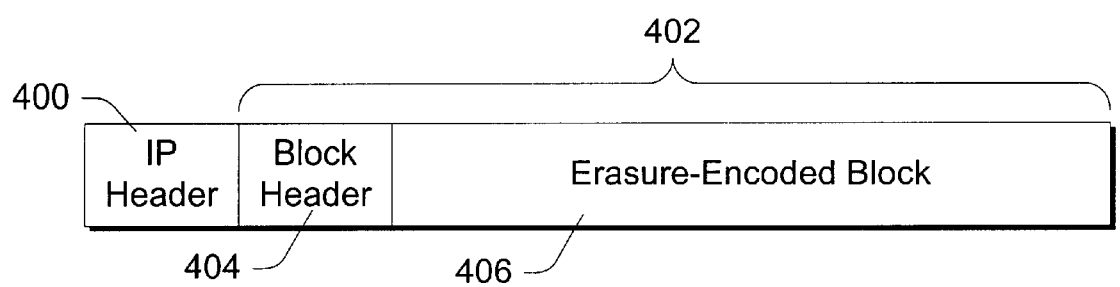
FIG. 18 is a block diagram illustrating an IP packet in accordance with the invention.

FIG. 18 shows the general makeup of an IP multicast packet in the described embodiments of the invention. The IP packet itself comprises an IP header 400 and an IP payload 402 in accordance with conventional IP multicast technology. The IP payload comprises a block header 404 and an erasure-encoded block 406.

The block header 404 includes the following parameters:

A sequence number that is unique for each packet of a transmitted data object. The sequence number increases monotonically with each packet sent, allowing the receiver to track packet loss.

A file identifier—an identifier assigned by the sender.

A file length specification indicating the length, in bytes, of the original data file. The file length is included so that the receiver can allocate memory structures for receiving the file once it has received the first erasure-encoded block.

A group identifier, indicating the group to which the erasure-encoded block belongs.

The value of k used in encoding and decoding the blocks. This value, in conjunction with the file length, allows the receiver to calculate the number of groups G.

An index value, indicating the position of the erasure-encoded block within its group. Packets with indices 0 through k−1 are original file blocks, while packets with indices k to n−1 are encoded blocks.

By including the file length and k in every packet, a receiver can begin receiving without having to obtain additional, out-of-band information. Additionally, including k in each header allows k to be varied for different groups as discussed above.

The packet size and the value of n are not specified in the block header—they are not needed by the receiver for proper reception.

Conclusion

The embodiments described above provide useful improvements over previously described methods of distributing data files and other objects using data carousels and forward error correction. In particular, the discussion above allows optimization of k and also provides a practical solution to the problem of caching received blocks at a speed sufficient to keep up with a fast multicast transmission, while also minimizing subsequent decoding time after reception has been completed.

Although the invention has been described in language specific to structural features and/or methodological steps, it is to be understood that the invention defined in the appended claims is not necessarily limited to the specific features or steps described. Rather, the specific features and steps are disclosed as preferred forms of implementing the claimed invention.

What is claimed is:

1. A method of distributing a data object over a computer network, wherein the data object comprises S data object blocks, the method comprising:

determining the minimum number of groups G of erasure-encoded blocks that can represent the S data object blocks, wherein each group of erasure-encoded blocks represents no more than a predefined number $k_{max}$ data object blocks;

determining the smallest number of data object blocks $k_{min}$ that can be represented in each group while still requiring no more than G groups of erasure-encoded blocks to represent the S data object blocks;

representing no more than $k_{min}$ data object blocks within each group of erasure-encoded blocks; and transmitting the erasure-encoded blocks of the groups in a data carousel over a network for reception by multiple network receivers.

2. A method as recited in claim 1, wherein the step of determining the minimum number of groups G comprises calculating G=ceiling(S/$k_{max}$).

3. A method as recited in claim 1, wherein the step of determining the smallest number of data object blocks in a group, $k_{min}$ comprises calculating $k_{min}$=ceiling(S/G).

4. A method as recited in claim 1, wherein:

the step of determining the minimum number of groups G comprises evaluating the integer expression G=ceiling (S/$k_{max}$); and step of determining the smallest number of data object blocks $k_{min}$ comprises evaluating the integer expression $k_{min}$=ceiling(S/G).

5. A method as recited in claim 1, further comprising padding one or more of the groups with placeholder data object blocks so that each group of erasure-encoded blocks represents an identical number ($k_{min}$)of data object blocks.

6. A method as recited in claim 1, further comprising varying the number of data object blocks represented in the different groups of erasure-encoded blocks.

7. A method as recited in claim 1, further comprising:

varying the number of data object blocks represented in the different groups of erasure-encoded blocks; and in the data carousel, transmitting the number of data object blocks represented by each group of erasure-encoded blocks.

8. A method as recited in claim 1, further comprising:

varying the number of data object blocks represented in the different groups of erasure-encoded blocks; and along with each erasure-encoded block, transmitting the number of data object blocks represented by the group representing said erasure-encoded block.

9. A method as recited in claim 1, wherein each erasure-encoded block is sent in a respective IP packet.

10. A method as recited in claim 1, wherein the transmitting step comprising multicasting the erasure-encoded blocks in a data carousel.

11. A method as recited in claim 1, wherein the transmitting step comprising IP multicasting the erasure-encoded blocks in a data carousel.

12. A data server programmed to perform steps as recited in claim 1.

13. A computer-readable storage medium containing a program, the program comprising steps as recited in claim 1.

14. One or more computer-readable storage media containing a program for distributing a data object over a computer network, wherein the data object comprises S data object blocks, the program comprising:

determining a number of groups G of erasure-encoded blocks in accordance with the integer expression G=ceiling(S/$k_{max}$), where $k_{max}$ is the maximum number of data object blocks that may be in any individual group of erasure-encoded blocks;

determining a number of data object blocks $k_{min}$ in accordance with the expression $k_{min}$=ceiling(S/G);

representing no more than $k_{min}$ data object blocks within each group of erasure-encoded blocks; and transmitting the erasure-encoded blocks of the groups in a data carousel over a network for reception by multiple network receivers.

15. One or more computer-readable storage media as recited in claim 14, the program further comprising padding one or more of the groups with placeholder data object blocks so that each group of erasure-encoded blocks represents an identical number of data object blocks.

16. One or more computer-readable storage media as recited in claim 14, the program further comprising varying the number of data object blocks represented in the different groups of erasure-encoded blocks.

17. One or more computer-readable storage media as recited in claim 14, the program further comprising:

varying the number of data object blocks represented in the different groups of erasure-encoded blocks; and in the data carousel, transmitting the number of data object blocks represented by each group of erasure-encoded blocks.

18. One or more computer-readable storage media as recited in claim 14, the program further comprising:

varying the number of data object blocks represented in the different groups of erasure-encoded blocks; and along with each erasure-encoded block, transmitting the number of data object blocks represented by the group representing said erasure-encoded block.

19. One or more computer-readable storage media as recited in claim 14, wherein each erasure-encoded block is sent in a respective IP packet.

20. One or more computer-readable storage media as recited in claim 14, wherein the transmitting step comprising multicasting the erasure-encoded blocks in a data carousel.

21. One or more computer-readable storage media as recited in claim 14, wherein the transmitting step comprising IP multicasting the erasure-encoded blocks in a data carousel.

22. A computer network comprising:

a data server having access to a data object;

a plurality of network clients connectable to communicate with the data server using an IP communications medium;

the data server being configured to transmit the data object to the network clients as a plurality of erasure-encoded blocks in a multicast data carousel, each erasure-encoded block being packaged in a multicast IP packet;

wherein:

the data object comprises S data object blocks;

the data carousel includes a number of groups G of erasure-encoded blocks in accordance with the integer expression $G=\text{ceiling}(S/k_{max})$, where $k_{max}$ is the maximum number of data object blocks that may be in any individual group of erasure-encoded blocks; and the number of data object blocks in each group is no more than $k_{min}$, where $k_{min}=\text{ceiling}(S/G)$.

23. A computer network as recited in claim 22, wherein the data server pads one or more of the groups with placeholder data object blocks so that each group of erasure-encoded blocks represents an identical number of data object blocks.

24. A computer network as recited in claim 22, wherein the data server varies the number of data object blocks represented in the different groups of erasure-encoded blocks.

25. A computer network as recited in claim 22, wherein:

the data server varies the number of data object blocks represented in the different groups of erasure-encoded blocks; and the data server transmits, in the data carousel, the number of data object blocks represented by each group of erasure-encoded blocks.

26. A computer network as recited in claim 22, wherein:

the data server varies the number of data object blocks represented in the different groups of erasure-encoded blocks; and the data server transmits, along with each erasure-encoded block, the number of data object blocks represented by the group representing said erasure-encoded block.

\* \* \* \* \*

UNITED STATES PATENT AND TRADEMARK OFFICE
CERTIFICATE OF CORRECTION

PATENT NO. : 6,678,855 B1  Page 1 of 1
DATED : January 13, 2004
INVENTOR(S) : Gemmell It is certified that error appears in the above-identified patent and that said Letters Patent is hereby corrected as shown below:

<u>Column 9,</u>
Line 1, delete "to" between "in" and "an".

Signed and Sealed this

First Day of June, 2004

JON W. DUDAS
*Acting Director of the United States Patent and Trademark Office*